(12) United States Patent
Wakabayashi

(10) Patent No.: US 11,846,020 B2
(45) Date of Patent: Dec. 19, 2023

(54) PARTICLE COATING METHOD

(71) Applicant: SEIKO EPSON CORPORATION, Tokyo (JP)

(72) Inventor: Momoko Wakabayashi, Hachinohe (JP)

(*) Notice: Subject to any disclaimer, the term of this patent is extended or adjusted under 35 U.S.C. 154(b) by 0 days.

(21) Appl. No.: 17/104,475

(22) Filed: Nov. 25, 2020

(65) Prior Publication Data

US 2021/0156025 A1 May 27, 2021

(30) Foreign Application Priority Data

Nov. 26, 2019 (JP) ................. 2019-213053

(51) Int. Cl.
C23C 16/44 (2006.01)
H01F 1/153 (2006.01)
C23C 16/40 (2006.01)
C23C 16/455 (2006.01)
H01F 41/00 (2006.01)

(52) U.S. Cl.
CPC ........ *C23C 16/4417* (2013.01); *C23C 16/402* (2013.01); *C23C 16/45555* (2013.01); *H01F 1/153* (2013.01); *H01F 41/00* (2013.01)

(58) Field of Classification Search
None
See application file for complete search history.

(56) References Cited

U.S. PATENT DOCUMENTS

| | | | | |
|---|---|---|---|---|
| 2010/0193726 A1* | 8/2010 | Maeda | ...................... | C09C 1/62 252/62.54 |
| 2016/0308405 A1* | 10/2016 | Thompson | ............... | H02K 1/02 |
| 2018/0043431 A1* | 2/2018 | Araki | ........................ | B22F 9/02 |
| 2018/0200787 A1* | 7/2018 | Saito | ........................ | B22F 3/00 |
| 2019/0010586 A1* | 1/2019 | Kim | ........................ | H05K 9/00 |

FOREIGN PATENT DOCUMENTS

| | | |
|---|---|---|
| JP | 2006351946 A | 12/2006 |
| JP | 2016086124 A | 5/2016 |
| JP | 2019106414 A | 6/2019 |

OTHER PUBLICATIONS

Hakim et al., "Effect of structural parameters on soft magnetic properties of two phase nanocrystalline alloy of Fe73.5Cu1Ta3Si13.5B9", Journal of Magnetism and Magnetic Materials, 284 (2004), pp. 395-402 (Year: 2004).*
Office Action for JP Patent Application No. JP2019213053, dated May 30, 2023, 8 pages of Office Action.

* cited by examiner

*Primary Examiner* — Shamim Ahmed
*Assistant Examiner* — Bradford M Gates
(74) *Attorney, Agent, or Firm* — CHIP LAW GROUP

(57) ABSTRACT

A particle coating method includes a heating step of heating soft magnetic metal particles containing an amorphous phase within a temperature range of 100° C. or higher and 500° C. or lower for 0.1 hours or more and 300 hours or less, and an insulating film formation step of forming an insulating film at surfaces of the soft magnetic metal particles by a chemical vapor deposition method. The soft magnetic metal particles preferably contain the amorphous phase at 50 vol % or more.

3 Claims, 3 Drawing Sheets

PARTICLE COATING METHOD

The present application is based on, and claims priority from JP Application Serial Number 2019-213053, filed on Nov. 26, 2019, the disclosure of which is hereby incorporated by reference herein in its entirety.

BACKGROUND

1. Technical Field

The present disclosure relates to a particle coating method.

2. Related Art

In a magnetic powder to be used in an inductor or the like, it is necessary to suppress an eddy current flowing between particles or insulate between terminals by subjecting the surfaces of the particles to an insulation treatment. Therefore, a method for forming an insulating coating film at the surfaces of the particles of a magnetic powder have been studied using various types of film formation methods.

For example, JP-A-2016-86124 (Patent Document 1) discloses a production method for a soft magnetic body including a step of forming a silicon dispersion layer at a surface layer of each of iron-based soft magnetic base material particles by a mechanofusion method, a step of coating the iron-based soft magnetic base material particles for which the silicon dispersion layer is formed with soft magnetic ferrite, a step of producing a powder-compression molded body by compressing a powder constituted by the iron-based soft magnetic base material particles coated with the soft magnetic ferrite, and a step of sintering the powder-compression molded body.

The mechanofusion method is a dry treatment method in which a substance is fused to another substance by utilizing a mechanical energy. In this method, the silicon dispersion layer can be formed without using a heat treatment.

The iron-based soft magnetic base material particles described in Patent Document 1 have an average particle diameter of 50 µm or more and 200 µm or less. In such particles, a strain involved in the production process such as pulverization or cooling is generally included. This strain is a cause for increasing the coercive force of the iron-based soft magnetic base material particles. In particular, when the average particle diameter is smaller than the above range, there is a tendency that more strains are included therein.

Further, in the method described in Patent Document 1, the silicon dispersion layer is formed by utilizing a mechanical energy, and therefore, a strain is further applied to the soft magnetic base material particles. The strain applied in this manner is a cause for further increasing the coercive force of the iron-based soft magnetic base material particles.

SUMMARY

A particle coating method according to an application example of the present disclosure includes a heating step of heating soft magnetic metal particles containing an amorphous phase within a temperature range of 100° C. or higher and 500° C. or lower for 0.1 hours or more and 300 hours or less; and an insulating film formation step of forming an insulating film at surfaces of the soft magnetic metal particles by a chemical vapor deposition method.

DESCRIPTION OF EXEMPLARY EMBODIMENTS

Hereinafter, preferred embodiments of a particle coating method according to the present disclosure will be described in detail with reference to the accompanying drawings.

1. First Embodiment 1.1. Particle Coating Apparatus to be Used for Atomic Layer Deposition Method First, one example of a particle coating apparatus to be used for a particle coating method according to a first embodiment will be described.

Figure 1:
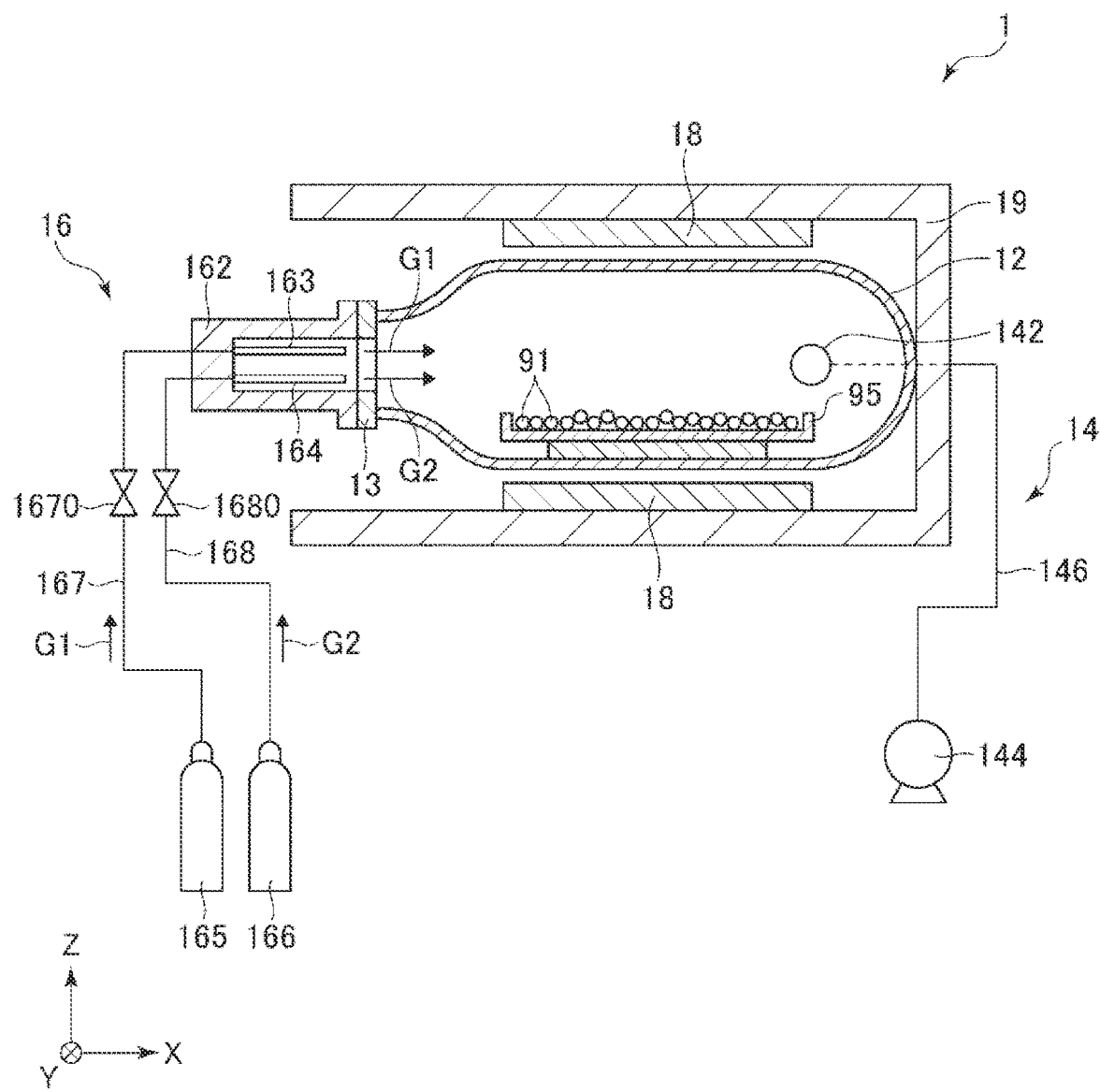
FIG. 1 is a cross-sectional view showing one example of a particle coating apparatus to be used for a particle coating method according to a first embodiment.
Figure 2:
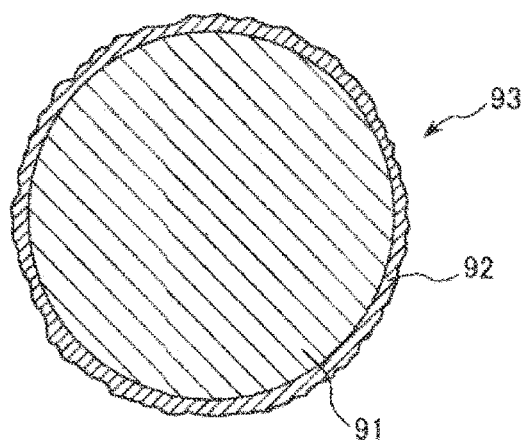
FIG. 2 is a cross-sectional view schematically showing a magnetic particle with an insulating film to be produced by the particle coating method.

FIG. 1 is a cross-sectional view showing one example of a particle coating apparatus to be used for a particle coating method according to a first embodiment. FIG. 2 is a cross-sectional view schematically showing a magnetic particle with an insulating film to be produced by the particle coating method. In FIG. 1, for the sake of convenience of explanation, as three axes orthogonal to each other, X axis, Y axis, and Z axis are set, and the respective axes are shown by arrows. Further, the Z axis is a vertical axis, and X-Y plane is a horizontal plan. The base end side of the arrow of each axis is referred to as a minus side of each axis, and the tip side is referred to as a plus side of each axis.

A particle coating apparatus 1 shown in FIG. 1 is an apparatus for forming an insulating film 92 at surfaces of soft magnetic metal particles 91 by an atomic layer deposition (ALD) method that is one type of chemical vapor deposition method. The particle coating apparatus 1 includes a chamber 12, an exhaust portion 14, a gas introduction portion 16, and a heating portion 18. In the particle coating apparatus 1, the soft magnetic metal particles 91 are stored in the chamber 12, the inside of the chamber 12 is exhausted by the exhaust portion 14, and thereafter, a gas is introduced by the gas introduction portion 16. Then, the soft magnetic metal particles 91 are heated by the heating portion 18. By this heating, a raw material gas G1 introduced into the chamber 12 is thermally decomposed, and a decomposed product is adsorbed to the surfaces of the soft magnetic metal particles 91, whereby the insulating film 92 shown in FIG. 2 is finally formed.

The chamber 12 is a container that contains the soft magnetic metal particles 91. The chamber 12 shown in FIG. 1 has a cylindrical shape having an axis parallel to the X axis as one example. An end portion at the minus side of the X axis of the chamber 12 is opened, and an end portion at the plus side of the X axis of the chamber 12 is closed.

Examples of a constituent material of the chamber 12 include glass materials such as quartz glass, ceramic materials such as alumina, and nonmagnetic metal materials such as aluminum and titanium. In this embodiment, as one example, a material having a light transmission property such as quartz glass is adopted.

To the end portion at the minus side of the X axis of the chamber 12, a flange 13 is attached. Then, the chamber 12 and the below-mentioned gas introduction portion 16 are airtightly coupled through the flange 13.

The exhaust portion 14 is provided in the vicinity of the end portion at the plus side of the X axis of the chamber 12, and includes an exhaust port 142 provided at the plus side of the X axis, an exhaust pump 144, and a pipe 146 that couples the exhaust port 142 to the exhaust pump 144. The inside of the chamber 12 can be depressurized by exhausting the inside of the chamber 12 by the exhaust portion 14.

A valve may be provided for the exhaust port 142 or the pipe 146 as needed.

The gas introduction portion 16 supplies the raw material gas G1, an oxidizing agent G2, or the like necessary for forming the insulating film 92 into the chamber 12. The gas introduction portion 16 shown in FIG. 1 includes a support member 162, nozzles 163 and 164, a raw material gas storage portion 165, an oxidizing agent storage portion 166, and pipes 167 and 168.

The support member 162 is airtightly coupled to the flange 13, and supports the nozzles 163 and 164. According to this, a closed space is formed by the chamber 12, the flange 13, and the support member 162, and when forming the insulating film 92, the closed space is depressurized.

The raw material gas storage portion 165 stores the raw material gas G1, and the oxidizing agent storage portion 166 stores the oxidizing agent G2. The pipe 167 couples the raw material gas storage portion 165 to the nozzle 163, and the pipe 168 couples the oxidizing agent storage portion 166 to the nozzle 164.

A spout of the nozzle 163 is provided inside the support member 162, and the nozzle 163 sprays the raw material gas G1 sent through the pipe 167 into the chamber 12. A spout of the nozzle 164 is provided inside the support member 162, and the nozzle 164 sprays the oxidizing agent G2 sent through the pipe 168 into the chamber 12.

In the middle of the pipe 167, a valve 1670 for adjusting the flow rate of the raw material gas G1 is provided, and in the middle of the pipe 168, a valve 1680 for adjusting the flow rate of the oxidizing agent G2 is provided. By the operation of the valves 1670 and 1680, the partial pressure of each of the raw material gas G1 and the oxidizing agent G2 in the chamber 12 can be controlled.

The raw material gas G1 and the oxidizing agent G2 are supplied together with a carrier gas containing, as a main component, an inert gas such as nitrogen gas or argon gas as needed.

The heating portion 18 is provided outside the chamber 12. In this embodiment, the heating portion 18 is an infrared radiation heater that radiates an infrared ray. By the infrared ray radiated from the heating portion 18, the soft magnetic metal particles 91 can be heated from the outside of the chamber 12.

The heating principle and the arrangement of the heating portion 18 are not limited to those described above. The heating portion 18 may be, for example, a heater block, a film heater, a sheet heater, a sheath heater, or the like, each having a built-in heater wiring. Such a heater, for example, heats the chamber 12, and the soft magnetic metal particles 91 can be heated by the heated chamber 12. The heating portion 18 need not cover the entire chamber 12, and may be provided only for a portion.

Further, the particle coating apparatus 1 shown in FIG. 1 includes a cover 19 that covers the chamber 12 and the heating portion 18. By the cover 19, the heating portion 18 is supported.

A tray 95 is provided inside the chamber 12. The tray 95 is a container that stores the soft magnetic metal particles 91. A constituent material of the tray 95 is appropriately selected from the materials exemplified as the constituent material of the chamber 12 described above.

The tray 95 may be provided with a mechanism for shaking or stirring the stored soft magnetic metal particles 91 as needed. According to this, each soft magnetic metal particle 91 can be rotated, and therefore, the insulating film 92 can be evenly formed at the surfaces of the soft magnetic metal particles 91.

Further, although not shown in the drawing, a magnetic field generation mechanism for generating a magnetic field may be provided inside or outside the chamber 12 for fixing the soft magnetic metal particles 91 by a magnetic force. By using the magnetic force, the soft magnetic metal particles 91 can be fixed without hiding the surfaces of the soft magnetic metal particles 91 behind a member or the like. Accordingly, the insulating film 92 can be evenly formed at the surfaces of the soft magnetic metal particles 91.

In such a particle coating apparatus 1, the insulating film 92 is formed by a chemical vapor deposition method as described above, and in this embodiment, as the chemical vapor deposition method, an atomic layer deposition method is used. The atomic layer deposition method is, for example, a method in which introduction and exhaust of two types of gasses: the raw material gas G1 and the oxidizing agent G2, or more than two types of gasses are alternately repeated so as to react the raw material molecules adsorbed to a film-formation target face, thereby forming a film. According to this method, the film thickness of the insulating film 92 to be formed can be controlled with high accuracy. Accordingly, a particularly thin insulating film 92 can be evenly formed. Therefore, when the soft magnetic metal particles 91 have soft magnetism, if the film thickness of the insulating film 92 that covers the surface thereof can be made thinner, a powder magnetic core in which the packing density of the soft magnetic metal particles 91 per unit volume is high while favorably maintaining the insulating property of the soft magnetic metal particles 91 can be produced. According to this, magnetic particles 93 with an insulating film capable of producing a powder magnetic core or the like having particularly high magnetic properties such as magnetic flux density and magnetic permeability can be realized.

Further, in the atomic layer deposition method, the raw material gas G1 or the oxidizing agent G2 penetrates even into a fine gap to form a film, and therefore, a portion where a film is not formed hardly occurs, and the insulating film 92 having a uniform film thickness can be formed. Accordingly, the magnetic particles 93 with an insulating film configured to coat the surfaces of the soft magnetic metal particles 91 with the insulating film 92 having a uniform and thin film thickness can be obtained.

Next, the soft magnetic metal particles 91 will be described.

As the soft magnetic metal particles 91, metal particles having soft magnetism are used.

Examples of a constituent material of the soft magnetic metal particles 91 include pure iron, various types of Fe-based alloys such as an Fe—Si-based alloy such as a silicon steel, an Fe—Ni-based alloy such as permalloy, an Fe—Co-based alloy such as permendur, an Fe—Si—Al-based alloy such as Sendust, and an Fe—Cr—Si-based alloy, and other than these, various types of Ni-based alloys, various types of Co-based alloys, and various types of amorphous alloys. Among these, examples of the amorphous alloys include Fe-based alloys such as Fe—Si—B-based, Fe—Si—B—C- based, Fe—Si—B—Cr—C-based, Fe—Si—Cr-based, Fe—B-based, Fe—P—C-based, Fe—Co—Si—B-based, Fe—Si—B—Nb-based, and Fe—Zr—B-based alloys, Ni-based alloys such as Ni—Si—B-based and Ni—P—B-based alloys, and Co-based alloys such as Co—Si—B-based alloys.

An average particle diameter D50 of the soft magnetic metal particles 91 is not particularly limited, but is preferably 0.1 μm or more and 50.0 μm or less, more preferably 0.5 μm or more and 10.0 μm or less, further more preferably 1.0 μm or more and 3.5 μm or less. In such relatively small soft magnetic metal particles 91, the eddy current loss in the particles can be suppressed low, and therefore, it is useful as soft magnetic particles for a powder magnetic core. Further, the packing density of the soft magnetic metal particles 91 in a powder magnetic core can be increased, and therefore, a powder magnetic core having excellent magnetic properties can be realized.

The average particle diameter D50 of the soft magnetic metal particles 91 is determined as a particle diameter when the cumulative amount from a small diameter side reaches 50% in a mass-based cumulative particle size distribution obtained by laser diffractometry.

Further, the soft magnetic metal particles 91 contain at least an amorphous phase, and may contain a crystal phase other than this. In particular, the soft magnetic metal particles 91 contain the amorphous phase preferably at a ratio of 50 vol % or more, more preferably at a ratio of 60 vol % or more. By including the amorphous phase at such a ratio in the soft magnetic metal particles 91, the soft magnetic metal particles 91 that realize excellent low coercive force and low eddy current loss derived from the amorphous phase are obtained.

The ratio of the amorphous phase in the soft magnetic metal particles 91 is determined from the "degree of crystallinity" calculated by applying the following formula to a spectrum obtained from the soft magnetic metal particles 91 by X-ray diffraction.

Degree of crystallinity={intensity derived from crystal phase/(intensity derived from crystal phase+ intensity derived from amorphous phase)}×100

The degree of crystallinity to be determined corresponds to the volume ratio of the crystal phase contained in the soft magnetic metal particles 91, and the unit is, for example, vol %. Therefore, the ratio of the amorphous phase is determined by subtracting the degree of crystallinity from 100 vol %.

As an X-ray diffractometer, for example, RINT2500V/PC manufactured by Rigaku Corporation is used.

The soft magnetic metal particles 91 may be those produced by any method. Examples of a production method for the soft magnetic metal particles 91 include atomization methods such as a water atomization method, a gas atomization method, and a spinning water atomization method, and other than these, a pulverization method in which a foil strip, a wire, or the like is pulverized and powdered.

1.2. Particle Coating Method Using Atomic Layer Deposition Method

Next, as the particle coating method according to the first embodiment, a method for forming the insulating film 92 at the surfaces of the soft magnetic metal particles 91 using the particle coating apparatus 1 shown in FIG. 1 will be described.

Figure 3:
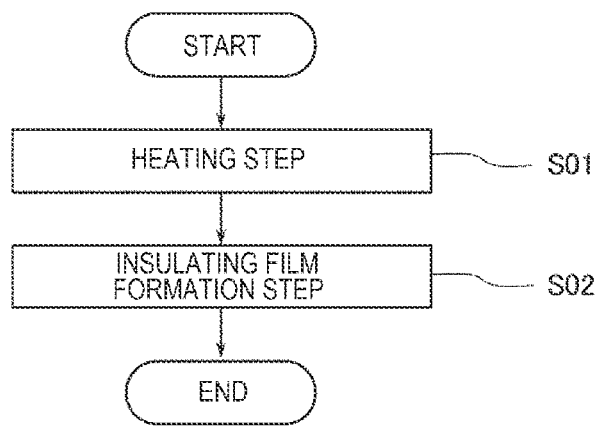
FIG. 3 is a process chart showing the particle coating method according to the first embodiment.

FIG. 3 is a process chart showing the particle coating method according to the first embodiment.

1.2.1. Heating Step S01

First, the soft magnetic metal particles 91 are fed into the chamber 12. When the soft magnetic metal particles 91 are fed therein, the operation may be performed by, for example, opening between the flange 13 and the support member 162 of the particle coating apparatus 1 shown in FIG. 1. The feeding route is not particularly limited.

Subsequently, the flange 13 and the support member 162 are coupled to each other, and the inside of the chamber 12 is exhausted by the exhaust pump 144. By doing this, the inside of the chamber 12 is depressurized.

Subsequently, the soft magnetic metal particles 91 fed into the chamber 12 are subjected to a pretreatment as needed. Examples of the pretreatment include an ozone treatment, a radical treatment, a UV treatment, a plasma treatment, a corona treatment, a drying treatment, and a solvent treatment. The pretreatment may be performed after the below-mentioned heating treatment.

Subsequently, the soft magnetic metal particles 91 fed into the chamber 12 are heated. This heating may be performed in a temporally overlapping manner with the below-mentioned film formation of the insulating film 92, or may be performed separately from the film formation, that is, without temporal overlap with the film formation. In other words, a heating step S01 and a below-mentioned insulating film formation step S02 may be performed in the same time zone at least in part or may be performed in different time zones.

The heating temperature is set to 100° C. or higher and 500° C. or lower, but is set to preferably 150° C. or higher and 450° C. or lower, more preferably 200° C. or higher and 400° C. or lower. Further, the heating time at such a heating temperature is set to 0.1 hours or more and 300 hours or less, but is appropriately set according to the heating temperature, and is set to preferably 0.5 hours or more and 50 hours or less, more preferably 1 hour or more and 40 hours or less.

By heating under such heating conditions, a strain included in the soft magnetic metal particles 91 can be relaxed. This strain refers to a stress strain generated due to pulverization when producing the soft magnetic metal particles 91, a thermal strain generated due to cooling, or the like. By heating under the above-mentioned heating conditions, a strain can be relaxed while suppressing the crystallization of the amorphous phase contained in the soft magnetic metal particles 91. As a result, in the soft magnetic metal particles 91, while maintaining the excellent low coercive force and low eddy current loss derived from the amorphous phase, the coercive force can be further decreased with the relaxation of the strain.

The above-mentioned heating time refers to a cumulative time in which the soft magnetic metal particles 91 stay within the above-mentioned heating temperature range. Therefore, the soft magnetic metal particles 91 need not continuously stay within the above-mentioned heating temperature range, but are preferably continuously stay within the above-mentioned heating temperature range from the viewpoint that the strain is easily relaxed.

Further, the product of the heating temperature by the heating time is preferably 500 [° C.·hour] or more and 10000 [° C.·hour] or less, more preferably 1000 [° C.·hour] or more and 9000 [° C.·hour] or less. According to this, heating over a relatively longtime becomes possible, and therefore, the heating temperature can be decreased, so that the strain in the soft magnetic metal particles 91 can be sufficiently relaxed while suppressing the crystallization of the amorphous phase. Further, when the heating step S01 and the insulating film formation step S02 are performed in the same time zone, the film thickness of the insulating film 92 can be optimized.

That is, when the product of the heating temperature by the heating time is below the above lower limit, the strain in the soft magnetic metal particles 91 may not be able to be sufficiently relaxed or the film thickness of the insulating film 92 may become insufficient. On the other hand, when the product of the heating temperature by the heating time exceeds the above upper limit, depending on the heating temperature, the amorphous phase may be crystallized or the film thickness of the insulating film 92 may become too thick.

The product of the heating temperature by the heating time is determined as a time integrated value of the heating temperature.

The pressure in the chamber 12 during heating is preferably, for example, 100 Pa or less. By performing heating under such a reduced pressure, oxidation of the soft magnetic metal particles 91 is suppressed, and an increase in the coercive force due to oxidation can be suppressed.

1.2.2. Insulating Film Formation Step S02

In this step, the insulating film 92 is formed at the surfaces of the soft magnetic metal particles 91.

Specifically, first, the raw material gas G1 that is a precursor is introduced into the chamber 12 by the gas introduction portion 16 in a state where the inside of the chamber 12 is sealed up. The introduced raw material gas G1 is adsorbed to the surfaces of the soft magnetic metal particles 91. At that time, when the raw material gas G1 is adsorbed to the surfaces of the soft magnetic metal particles 91, further adsorption hardly occurs to form a multilayer. Therefore, the film thickness of the insulating film 92 to be finally obtained can be controlled with high accuracy. Further, the raw material gas G1 also penetrates into a portion behind or a portion to become a gap and is adsorbed thereto, and therefore, the film thickness of the insulating film 92 is made uniform.

As the raw material gas G1, for example, a gas containing the precursor of the insulating film 92 is exemplified. Specifically, for example, when a silicon-based insulating film 92 is formed, as the raw material gas G1, a secondary amine such as dimethylamine, methylethylamine, or diethylamine, a reaction product of a secondary amine with trihalosilane such as tris(dimethylamino)silane, bis(diethylamino)silane, or bis(t-butylamino)silane, or the like is exemplified.

Subsequently, the raw material gas G1 in the chamber 12 is exhausted by the exhaust portion 14, and thereafter, an inert gas such as nitrogen gas or argon gas is introduced as needed. By doing this, the raw material gas G1 is replaced. The introduction of the inert gas can be performed in the same manner as the introduction of the raw material gas G1 or the oxidizing agent G2 although not shown in the drawing.

Subsequently, the inert gas in the chamber 12 is exhausted by the exhaust portion 14, and thereafter, the oxidizing agent G2 is introduced into the chamber 12 by the gas introduction portion 16. As the oxidizing agent G2, for example, ozone, plasma oxygen, water vapor, or the like is exemplified.

The oxidizing agent G2 reacts with the raw material gas G1 adsorbed to the surfaces of the soft magnetic metal particles 91, whereby the insulating film 92 is formed. The oxidizing agent G2 also penetrates into a portion behind or a portion to become a gap in the same manner as the raw material gas G1, and therefore, the film thickness of the insulating film 92 can be controlled uniformly with high accuracy.

Subsequently, the oxidizing agent G2 in the chamber 12 is exhausted by the exhaust portion 14, and thereafter, an inert gas is introduced as needed, and the oxidizing agent G2 is replaced. The insulating film 92 is formed as described above, and the magnetic particles 93 with an insulating film are obtained.

The introduction and exhaust of the raw material gas G1 and the introduction and exhaust of the oxidizing agent G2 may be repeated according to a necessary film thickness of the insulating film 92. The film thickness can be increased according to the number of repetitions. According to this, a desired film thickness can be easily obtained.

Thereafter, the magnetic particles 93 with an insulating film may be subjected to a post-treatment as needed. As the post-treatment, for example, a static elimination treatment, a radical treatment, or the like is exemplified.

Among these, the static elimination treatment is a treatment in which the charge amount due to electrification of the magnetic particles 93 with an insulating film is decreased. In the static elimination treatment, for example, an ionizer is used.

Examples of a constituent material of the insulating film 92 to be formed include oxides such as silicon oxide, hafnium oxide, tantalum oxide, titanium oxide, and chromium oxide, and nitrides such as aluminum nitride, titanium nitride, and tantalum nitride.

The film thickness of the insulating film 92 is not particularly limited, but, for example, is preferably 1 nm or more and 500 nm or less, more preferably 2 nm or more and 300 nm or less, further more preferably 4 nm or more and 200 nm or less. When it has such a film thickness, it can be uniformly formed in a relatively short time. Further, when using a chemical vapor deposition method, a dense insulating film 92 can be formed, and therefore, even if it has such a thin film thickness, it has a sufficient insulating ability. Therefore, the magnetic particles 93 with an insulating film capable of producing a powder magnetic core or the like having excellent magnetic properties can be realized.

As described above, the particle coating method according to this embodiment includes the heating step S01 of heating the soft magnetic metal particles 91 containing an amorphous phase within a temperature range of 100° C. or higher and 500° C. or lower for 0.1 hours or more and 300 hours or less, and the insulating film formation step S02 of forming the insulating film 92 at the surfaces of the soft magnetic metal particles 91 by an atomic layer deposition method that is a chemical vapor deposition method.

According to such a configuration, a strain included in the soft magnetic metal particles 91 can be relaxed while suppressing the crystallization of the amorphous phase. Therefore, while maintaining the excellent low coercive force and low eddy current loss derived from the amorphous phase, the coercive force can be further decreased with the relaxation of the strain, and the magnetic particles 93 with an insulating film having low coercive force and high quality can be produced. Further, the insulating film 92 which is dense and has an excellent insulating property derived from the chemical vapor deposition method can be evenly formed. Accordingly, the magnetic particles 93 with an insulating film capable of producing a powder magnetic core or the like, in which the packing density of the soft magnetic metal particles 91 is high, and which have excellent magnetic properties, can be realized.

Further, as described above, the heating step S01 and the insulating film formation step S02 may be performed without temporal overlap, but are preferably performed in a temporally overlapping manner. That is, it is preferred to form the insulating film 92 in a state where the soft magnetic metal particles 91 are heated. According to this, when, for example, an atomic layer deposition method is used as the chemical vapor deposition method, the reaction efficiency of the raw material gas with the oxidizing agent is enhanced, and the film quality of the insulating film 92 can be enhanced. Further, the times required for the respective steps can be integrated, and therefore, the time required for the production of the magnetic particles 93 with an insulating film can be reduced.

The produced magnetic particles 93 with an insulating film are used as an insulation-treated soft magnetic powder. As the application of such an insulation-treated soft magnetic powder, for example, a powder magnetic core for various types of magnetic elements such as an inductor, a motor core, a generator core, or a transformer core is exemplified.

2. Second Embodiment 2.1. Particle Coating Apparatus to be Used for Mist CVD Method Next, one example of a particle coating apparatus to be used for a particle coating method according to a second embodiment will be described.

Figure 4:
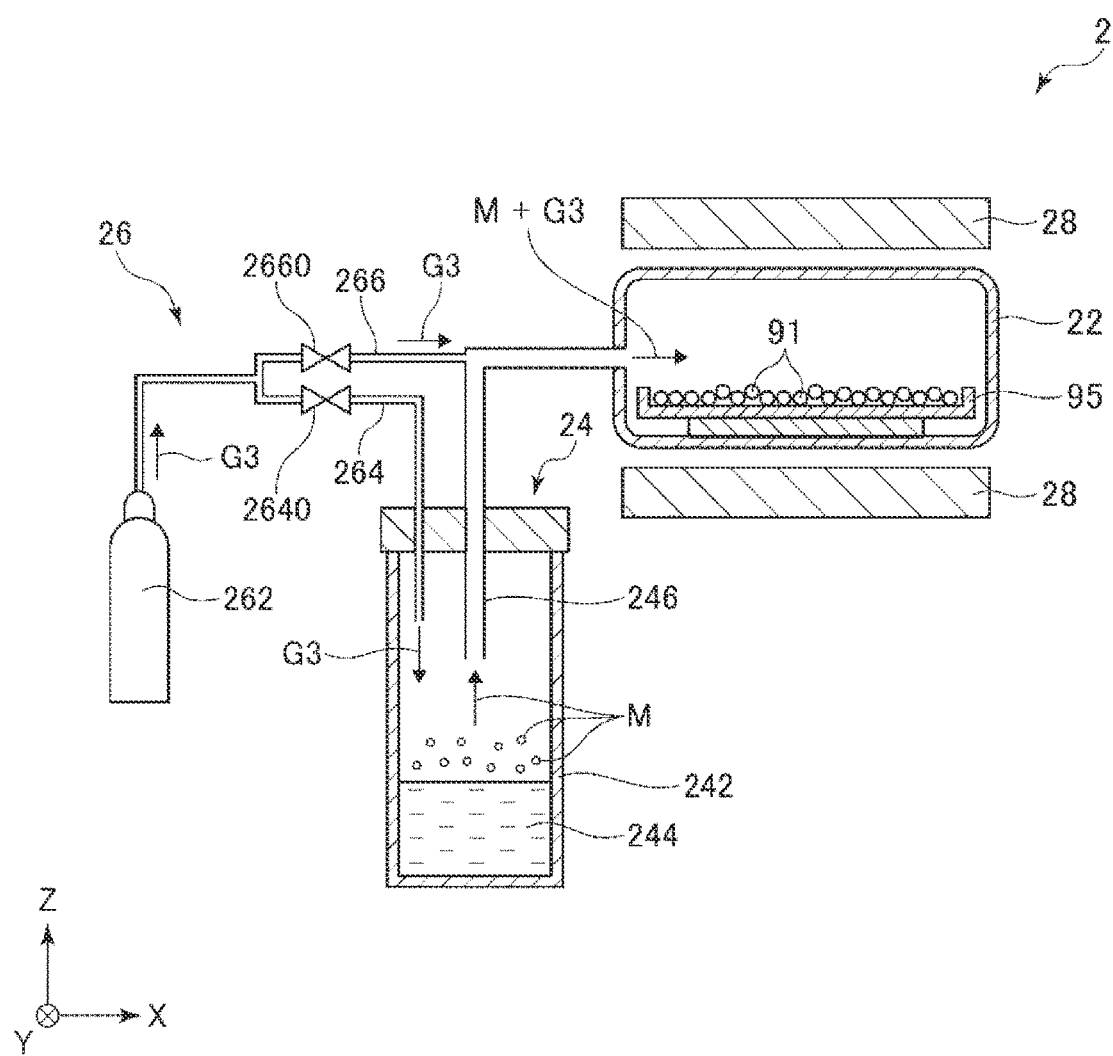
FIG. 4 is a cross-sectional view showing one example of a particle coating apparatus to be used for a particle coating method according to a second embodiment.

FIG. 4 is a cross-sectional view showing one example of a particle coating apparatus to be used for a particle coating method according to a second embodiment. In FIG. 4, for the sake of convenience of explanation, as three axes orthogonal to each other, X axis, Y axis, and Z axis are set, and the respective axes are shown by arrows.

Hereinafter, the second embodiment will be described, however, in the following description, different points from the first embodiment will be mainly described, and the description of the same matter will be omitted.

In the second embodiment, the insulating film 92 is formed by a mist CVD (Chemical Vapor Deposition) method that is one type of chemical vapor deposition method in place of the atomic layer deposition method.

A particle coating apparatus 2 shown in FIG. 4 is an apparatus for forming an insulating film 92 at surfaces of soft magnetic metal particles 91 by a mist CVD method. The particle coating apparatus 2 includes a chamber 22, a mist generation portion 24, a gas introduction portion 26, and a heating portion 28. In the particle coating apparatus 2, the soft magnetic metal particles 91 are stored in the chamber 22, and a raw material transformed into a mist by the mist generation portion 24 is introduced into the chamber 22 by the gas introduction portion 26. Then, the soft magnetic metal particles 91 are heated by the heating portion 28. By this heating, a raw material gas G1 is reacted, whereby the insulating film 92 is obtained.

The chamber 22 is a container that contains the soft magnetic metal particles 91. The chamber 22 shown in FIG. 4 has a cylindrical shape having an axis parallel to the X axis as one example. To an end portion at the minus side of the X axis of the chamber 22, a below-mentioned pipe 246 is coupled, and an end portion at the plus side of the X axis of the chamber 22 is closed.

Examples of a constituent material of the chamber 22 include glass materials such as quartz glass, ceramic materials such as alumina, and nonmagnetic metal materials such as aluminum and titanium. In this embodiment, as one example, a material having a light transmission property such as quartz glass is adopted.

Further, in the mist CVD method, a mist M containing a raw material is used, and therefore, penetration of the mist M can be utilized, and a portion where a film is not formed hardly occurs, and the insulating film 92 having a uniform film thickness can be formed. Accordingly, magnetic particles 93 with an insulating film configured to coat the surfaces of the soft magnetic metal particles 91 with the insulating film 92 having a uniform and thin film thickness can be obtained.

The mist generation portion 24 includes a container 242, a raw material liquid 244 that is stored in the container 242 and contains a precursor of a constituent material of the insulating film 92, and the pipe 246 that couples the container 242 to the chamber 22. In the container 242, an atomizer (mist generator) not shown in the drawing is provided. As the atomizer, for example, an ultrasonic vibrator or the like is exemplified.

As the precursor of the constituent material of the insulating film 92, a material capable of forming the constituent material of the insulating film 92 by a thermochemical reaction is used, and examples thereof include silica precursors such as polysilazane, tetraethoxysilane, triethoxymethylsilane, diethoxydimethylsilane, and silsesquioxane, alumina precursors such as triethoxyaluminum, trimethoxyaluminum, aluminum triethoxide, and methyldimethoxyaluminum, and other than these, boron nitride precursors, aluminum nitride precursors, and various types or metal alkoxides.

The raw material liquid 244 is prepared using such a precursor and a solvent or a dispersion medium. The solvent or the dispersion medium is not particularly limited as long as it is a vehicle capable of dissolving or dispersing the precursor, and examples thereof include water, methanol, ethanol, chloroform, cyclohexane, 1,2-dichloroethene, dichloromethane, 1,2-dimetoxyethane, hexane, 1,1,2-trichloroethene, t-butyl methyl ether, ethyl acetate, diethyl ether, dibutyl ether, ethyl formate, isopropyl acetate, methyl acetate, methyl ethyl ketone, pentane, xylene, benzene, and toluene, and among these, one type or a mixture of two or more types is used.

The concentration of the precursor in the raw material liquid 244 is appropriately set according to the film thickness of the insulating film 92, the particle diameters of the soft magnetic metal particles 91, the heating conditions, or the like, and therefore is not limited, but, for example, is preferably 0.01 mass % or more and 50 mass % or less, more preferably 0.1 mass % or more and 20 mass % or less.

Further, to the raw material liquid 244, an additive may be added as needed. Examples of the additive include a reaction catalyst, an ultraviolet absorber, a dispersant, a thickener, and a surfactant.

The gas introduction portion 26 supplies a carrier gas G3 containing an inert gas or the like to the mist generation portion 24. The gas introduction portion 26 shown in FIG. 4 includes a carrier gas storage portion 262 that stores the carrier gas G3, a pipe 264 that couples the carrier gas storage portion 262 to the container 242 of the mist generation portion 24, and a pipe 266 that couples the carrier gas storage portion 262 to the pipe 246 of the mist generation portion 24.

The carrier gas G3 supplied to the container 242 through the pipe 264 sends the mist M of the raw material liquid 244 to the pipe 246. Then, the mist M is sent to the chamber 22 together with the carrier gas G3 supplied to the pipe 246 through the pipe 266.

In the middle of the pipe 264, a valve 2640 for adjusting the flow rate of the carrier gas G3 flowing through the pipe 264 is provided, and in the middle of the pipe 266, a valve 2660 for adjusting the flow rate of the carrier gas G3 flowing through the pipe 266 is provided.

The heating portion 28 heats the soft magnetic metal particles 91 in the same manner as the heating portion 18 according to the first embodiment. In this embodiment, the heating portion 28 is an infrared radiation heater that radiates an infrared ray. By the infrared ray radiated from the heating portion 28, the soft magnetic metal particles 91 stored inside the chamber 22 can be heated from the outside of the chamber 22.

2.2. Particle Coating Method Using Mist CVD Method

Next, as the particle coating method according to the second embodiment, a method for forming the insulating film 92 at the surfaces of the soft magnetic metal particles 91 using the particle coating apparatus 2 shown in FIG. 4 will be described. In the following description, the method will be described with reference to the process chart shown in FIG. 3.

2.2.1. Heating Step S01

First, the soft magnetic metal particles 91 are fed into the chamber 22.

Subsequently, the soft magnetic metal particles 91 fed into the chamber 22 are heated. This heating may be performed in a temporally overlapping manner with the below-mentioned film formation of the insulating film 92, or may be performed without temporal overlap with the film formation. In other words, the heating step S01 and the below-mentioned insulating film formation step S02 may be performed in the same time zone at least in part or may be performed in different time zones.

The heating conditions are the same as those in the first embodiment. However, the pressure in the chamber 22 during heating may be less than the atmospheric pressure, but is preferably the atmospheric pressure. According to this, the film formation can be efficiently performed.

2.2.2. Insulating Film Formation Step S02

In this step, the insulating film 92 is formed at the surfaces of the soft magnetic metal particles 91.

Specifically, first, the mist M is introduced into the chamber 22 in a state where the soft magnetic metal particles 91 are heated. The introduced mist M causes a thermochemical reaction at the surfaces of the soft magnetic metal particles 91, whereby the insulating film 92 is formed.

As described above, in the mist CVD method, penetration of the mist M can be utilized, and a portion where a film is not formed hardly occurs, and the insulating film 92 having a uniform film thickness can be formed. Accordingly, the magnetic particles 93 with an insulating film configured to coat the surfaces of the soft magnetic metal particles 91 with the insulating film 92 having a uniform and thin film thickness can be obtained.

Examples of a constituent material of the insulating film 92 to be formed include oxides such as silicon oxide, hafnium oxide, tantalum oxide, and titanium oxide, and nitrides such as aluminum nitride, titanium nitride, and tantalum nitride.

The film thickness of the insulating film 92 is not particularly limited, but, for example, is preferably 1 nm or more and 500 nm or less, more preferably 2 nm or more and 100 nm or less. When it has such a film thickness, it can be uniformly formed in a relatively short time. Further, when using a chemical vapor deposition method, a dense insulating film 92 can be formed, and therefore, even if it has such a thin film thickness, it has a sufficient insulating ability. Therefore, the magnetic particles 93 with an insulating film capable of producing a powder magnetic core or the like having excellent magnetic properties can be realized.

As described above, the particle coating method according to this embodiment includes the heating step S01 of heating the soft magnetic metal particles 91 containing the amorphous phase within a temperature range of 100° C. or higher and 500° C. or lower for 0.1 hours or more and 300 hours or less, and the insulating film formation step S02 of forming the insulating film 92 at the surfaces of the soft magnetic metal particles 91 by a mist CVD method that is a chemical vapor deposition method.

According to such a configuration, a strain included in the soft magnetic metal particles 91 can be relaxed while suppressing the crystallization of the amorphous phase. Therefore, while maintaining the excellent low coercive force and low eddy current loss derived from the amorphous phase, the coercive force can be further decreased with the relaxation of the strain, and the magnetic particles 93 with an insulating film having low coercive force and high quality can be produced. Further, the insulating film 92 which is dense and has an excellent insulating property derived from the chemical vapor deposition method can be evenly formed. Accordingly, the magnetic particles 93 with an insulating film capable of producing a powder magnetic core or the like, in which the packing density of the soft magnetic metal particles 91 is high, and which have excellent magnetic properties, can be realized.

Further, as described above, the heating step S01 and the insulating film formation step S02 may be sequentially performed without temporal overlap, but are preferably performed in a temporally overlapping manner. That is, it is preferred to form the insulating film 92 in a state where the soft magnetic metal particles 91 are heated. According to this, when, for example, a mist CVD method is used as the chemical vapor deposition method, the efficiency of the thermochemical reaction of the precursor is enhanced, and the film quality of the insulating film 92 can be enhanced. Further, the times required for the respective steps can be integrated, and therefore, the time required for the production of the magnetic particles 93 with an insulating film can be reduced. The time of the heating step S01 and the time of the insulating film formation step S02 need only at least partially overlap with each other.

Hereinabove, the particle coating method according to the present disclosure has been described based on the embodiments shown in the drawings, but the present disclosure is not limited thereto. For example, the particle coating method according to the present disclosure may be a method in which a step for an arbitrary purpose may be added to the above-mentioned embodiments. Further, the chemical vapor deposition method may be a plasma CVD method, a thermal CVD method, or the like other than the above-mentioned two methods.

EXAMPLES

Hereinafter, specific Examples of the present disclosure will be described.

3. Production of Magnetic Particles with Insulating Film

Example 1

First, Fe—Si—B-based amorphous soft magnetic metal particles having an average particle diameter D50 of 3.5 μm were fed into a chamber made of quartz glass. The volume ratio of the amorphous phase in the used soft magnetic metal particles was 90%.

Subsequently, the inside of the chamber was exhausted by an exhaust portion and brought into a depressurized state.

Subsequently, the inside of the chamber was replaced with nitrogen gas, and thereafter, tris(dimethylamino)silane was introduced therein as a raw material gas (precursor). The heating temperature of the metal particles at that time was 200° C.

Subsequently, the raw material gas was exhausted by the exhaust portion.

Subsequently, the inside of the chamber was replaced with nitrogen gas, and thereafter, ozone was introduced therein as an oxidizing agent. By doing this, the raw material gas and the oxidizing agent are allowed to react with each other, whereby an insulating film constituted by silicon oxide was formed by an atomic layer deposition method (ALD method).

Subsequently, ozone was exhausted by the exhaust portion.

Thereafter, introduction and exhaust of the raw material gas, and introduction and exhaust of the oxidizing agent were repeated over 3 hours. By doing this, the film thickness of the insulating film was increased to 5 nm, whereby magnetic particles with an insulating film were obtained. During that period, the temperature of the metal particles was maintained at 200° C.

Example 2

Magnetic particles with an insulating film were obtained in the same manner as in Example 1 except that the film formation time of the insulating film, that is, the heating time of the soft magnetic metal particles was changed to 30 hours. The film thickness of the obtained insulating film was 50 nm.

Example 3

Magnetic particles with an insulating film were obtained in the same manner as in Example 1 except that the film formation temperature of the insulating film, that is, the heating temperature of the soft magnetic metal particles was changed to 400° C. The film thickness of the obtained insulating film was 5 nm.

Example 4

Before forming an insulating film, first, the soft magnetic metal particles were heated to 470° C. for 15 minutes.

Subsequently, an insulating film was formed at a heating temperature of 100° C. for a heating time of 3 hours by an atomic layer deposition method. The film thickness of the obtained insulating film was 0.5 nm.

Example 5

First, Fe—Si—B-based amorphous soft magnetic metal particles having an average particle diameter D50 of 3.5 µm were fed into a chamber made of quartz glass. The volume ratio of the amorphous phase in the used soft magnetic metal particles was 90%.

Subsequently, a raw material liquid containing tetraethoxysilane (TEOS) was transformed into a mist, and an insulating film constituted by silicon oxide was formed by a mist CVD method. The heating temperature of the metal particles at that time was 300° C. Thereafter, the supply of the raw material liquid was continued over 3 hours. By doing this, the film thickness of the insulating film was increased to 10 nm, whereby magnetic particles with an insulating film were obtained. During that period, the temperature of the metal particles was maintained at 300° C.

Example 6

Magnetic particles with an insulating film were obtained in the same manner as in Example 5 except that the film formation time of the insulating film, that is, the heating time of the soft magnetic metal particles was changed to 30 hours. The film thickness of the obtained insulating film was 100 nm.

Example 7

Magnetic particles with an insulating film were obtained in the same manner as in Example 5 except that the film formation temperature of the insulating film, that is, the heating temperature of the soft magnetic metal particles was changed to 400° C. The film thickness of the obtained insulating film was 10 nm.

Example 8

Before forming an insulating film, first, the soft magnetic metal particles were heated to 470° C. for 15 minutes.

Subsequently, an insulating film was formed at a heating temperature of 100° C. for a heating time of 3 hours by a mist CVD method. The film thickness of the obtained insulating film was 0.5 nm.

Examples 9 to 12

Magnetic particles with an insulating film were obtained in the same manner as in Example 1 or 5 except that the production conditions for the magnetic particles with an insulating film were changed as shown in Table 1.

Comparative Example 1

Magnetic particles with an insulating film were obtained in the same manner as in Example 1 except that the insulating film of silicon oxide was formed by a mechanofusion method. The heating temperature of the metal particles in the mechanofusion method was the heating temperature generated due to friction between the metal particles and the apparatus, and was 50° C. Further, the heating time was 15 minutes.

Comparative Example 2

Magnetic particles with an insulating film were obtained in the same manner as in Example 1 except that the heating temperature was set to 80° C., and the heating time was set to 50 hours.

Comparative Example 3

Magnetic particles with an insulating film were obtained in the same manner as in Example 5 except that the heating temperature was set to 80° C., and the heating time was set to 50 hours.

Comparative Example 4

Magnetic particles with an insulating film were obtained in the same manner as in Example 1 except that the heating temperature was set to 550° C., and the heating time was set to 30 minutes.

Comparative Example 5

Magnetic particles with an insulating film were obtained in the same manner as in Example 5 except that the heating temperature was set to 550° C., and the heating time was set to 30 minutes.

4. Evaluation of Magnetic Particle with Insulating Film 4.1. Evaluation of Volume Ratio of Amorphous Phase With respect to each of the magnetic particles with an insulating film obtained in the respective Examples and the respective Comparative Examples, the volume ratio of the amorphous phase was measured. The measurement results are shown in Table 1.

The evaluation results are shown in Table 1.

4.2. Evaluation of Coercive Force

With respect to each of the magnetic particles with an insulating film obtained in the respective Examples and the respective Comparative Examples, the coercive force was measured under the following measurement conditions.

Measurement Conditions for Coercive Force

Measurement Device: Vibrating Sample Magnetometer, VSM system manufactured by Tamakawa Co., Ltd., TM-VSM1230-MHHL Subsequently, the measured coercive force was evaluated according to the following evaluation criteria.

Evaluation Criteria for Coercive Force

A: The coercive force is less than 1.0 Oe.
B: The coercive force is 1.0 Oe or more and less than 1.4 Oe.
C: The coercive force is 1.4 Oe or more and less than 1.6 Oe.
D: The coercive force is 1.6 Oe or more and less than 1.8 Oe.
E: The coercive force is 1.8 Oe or more and less than 2.0 Oe.
F: The coercive force is 2.0 Oe or more.

The evaluation results are shown in Table 1.

As apparent from Table 1, in the respective Examples, the decrease in coercive force was achieved as compared with Comparative Examples. In addition, also the volume ratio of the amorphous phase hardly decreased.

On the other hand, among the respective Comparative Examples, the example in which the insulating film was formed using the mechanofusion method, there was a problem that the coercive force was high. Further, when the film formation temperature was too low, the insulating film having a sufficient film thickness could not be formed. In addition, when the film formation temperature was too high, there was a problem that the volume ratio of the amorphous phase significantly decreased.

What is claimed is:

1. A particle coating method, comprising:
a heating step of heating, under a pressure of 100 Pa or less, soft magnetic metal particles containing an amorphous phase at 50 vol % or more and a crystalline phase within a temperature range of 100° C. or higher and 500° C. or lower for 0.1 hours or more and 300 hours or less, wherein
a range of product of heating temperature by heating time is 1000 [° C. hour] or more and 9000 [° C. hour] or less, and
an insulating film formation step of forming an insulating film at surfaces of the soft magnetic metal particles by a chemical vapor deposition method, wherein
the insulating film formation step being performed after the heating step, or partially overlapping in time with the heating step.

2. The particle coating method according to claim 1, wherein the soft magnetic metal particles have an average particle diameter D50 of 0.1 μm or more and 50.0 μm or less.

TABLE 1

| | Production conditions for magnetic particles with insulating film | | | | | | | Evaluation results of magnetic particles with insulating film | |
|---|---|---|---|---|---|---|---|---|---|
| | Metal particles | | | Insulating film | | | | | |
| | Average particle diameter D50 μm | Volume ratio of amorphous phase vol % | Film formation method | Film formation temperature (heating temperature) ° C. | Film formation time (heating time) hour | Product ° C. · hour | Film thickness nm | Volume ratio of amorphous phase vol % | Coercive force |
| Example 1 | 3.5 | 90 | ALD method | 200 | 3 | 600 | 5 | 90 | C |
| Example 2 | 3.5 | 90 | ALD method | 200 | 30 | 6000 | 50 | 90 | B |
| Example 3 | 3.5 | 90 | ALD method | 400 | 3 | 1200 | 5 | 90 | A |
| Example 4 | 3.5 | 90 | ALD method | 470→100 | 3.25 | 418 | 0.5 | 90 | C |
| Example 5 | 3.5 | 90 | mist CVD method | 300 | 3 | 900 | 10 | 90 | B |
| Example 6 | 3.5 | 90 | mist CVD method | 300 | 30 | 9000 | 100 | 90 | A |
| Example 7 | 3.5 | 90 | mist CVD method | 400 | 3 | 1200 | 10 | 90 | A |
| Example 8 | 3.5 | 90 | mist CVD method | 470→100 | 3.25 | 418 | 0.5 | 90 | C |
| Example 9 | 1.0 | 99 | ALD method | 200 | 2 | 400 | 4 | 90 | C |
| Example 10 | 5.0 | 80 | ALD method | 300 | 40 | 12000 | 70 | 75 | C |
| Example 11 | 1.0 | 99 | mist CVD method | 300 | 3 | 750 | 10 | 90 | B |
| Example 12 | 5.0 | 80 | mist CVD method | 400 | 30 | 12000 | 100 | 75 | C |
| Comparative Example 1 | 3.5 | 90 | mechanofusion method | 50 | 0.25 | 13 | 0.5 | 85 | E |
| Comparative Example 2 | 3.5 | 90 | ALD method | 80 | 50 | 4000 | 0 | 90 | D |
| Comparative Example 3 | 3.5 | 90 | mist CVD method | 80 | 50 | 4000 | 0 | 90 | D |
| Comparative Example 4 | 3.5 | 90 | ALD method | 550 | 0.50 | 275 | 1 | 40 | F |
| Comparative Example 5 | 3.5 | 90 | mist CVD method | 550 | 0.50 | 275 | 1 | 40 | F |

3. The particle coating method according to claim 1, wherein the chemical vapor deposition method is an atomic layer deposition method.

\* \* \* \* \*